(12) United States Patent
Smith et al.

(10) Patent No.: US 6,395,651 B1
(45) Date of Patent: May 28, 2002

(54) SIMPLIFIED PROCESS FOR PRODUCING NANOPOROUS SILICA

(75) Inventors: Douglas M. Smith; Teresa Ramos; Kevin H. Roderick; Stephen Wallace, all of Albuquerque, NM (US); James Drage; Hui-Jung Wu, both of Fremont, CA (US); Neil Viernes, Champaign, IL (US); Lisa B. Brungardt, Albuquerque, NM (US)

(73) Assignee: AlliedSignal, Morristown, NJ (US)

(*) Notice: Subject to any disclaimer, the term of this patent is extended or adjusted under 35 U.S.C. 154(b) by 0 days.

(21) Appl. No.: 09/111,084

(22) Filed: Jul. 7, 1998

(51) Int. Cl.$^7$ .................. H01L 21/31; H01L 21/469

(52) U.S. Cl. .................. 438/787; 438/750; 438/790

(58) Field of Search .................. 438/758, 787, 438/790; 423/335, 336; 427/579

(56) References Cited

FOREIGN PATENT DOCUMENTS

| EP | 0 643 421 A2 | 8/1994 |
|----|--------------|--------|
| EP | 0 688 052 A2 | 5/1995 |
| EP | 0775669 | * 5/1997 |

OTHER PUBLICATIONS

Patent Abstracts of Japan, Publication No: 06082603, Publication Date: Mar. 25, 1994, Antireflective Optical Article and Its Surface Reforming Method.

* cited by examiner

Primary Examiner—Alexander G. Ghyka
(74) Attorney, Agent, or Firm—Roberts & Mercanti, LLP

(57) ABSTRACT

The present invention relates to low dielectric constant nanoporous silica films and to processes for their manufacture. A substrate, e.g., a wafer suitable for the production of an integrated circuit, having a plurality of raised lines and/or electronic elements present on its surface, is provided with a relatively high porosity, low dielectric constant, silicon-containing polymer film composition.

35 Claims, 3 Drawing Sheets

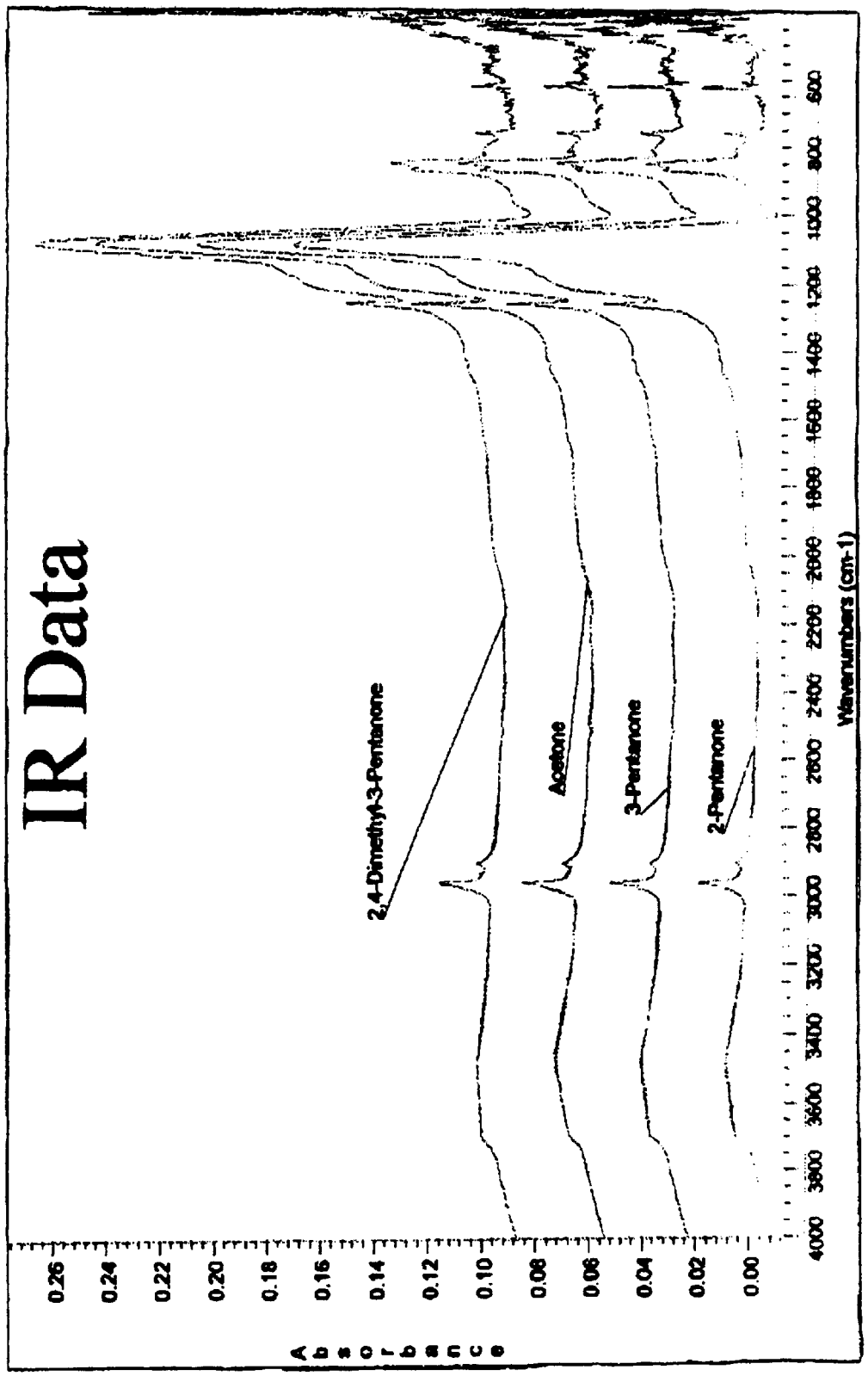

SIMPLIFIED PROCESS FOR PRODUCING NANOPOROUS SILICA

BACKGROUND OF THE INVENTION

1. Field of the Invention

The present invention relates to low dielectric constant nanoporous silica and to improved processes for producing the same on substrates suitable for use in the production of integrated circuits.

2. Description of the Prior Art

As feature sizes in integrated circuits approach 0.25 $\mu$m and below, problems with interconnect RC delay, power consumption and signal cross-talk have become increasingly difficult to resolve. It is believed that the integration of low dielectric constant materials for interlevel dielectric (ILD) and intermetal dielectric (IMD) applications will help to solve these problems.

Nanoporous Films

One material with a low dielectric constant is nanoporous silica, which, as a consequence of the introduction of air, which has a dielectric constant of 1, into the material via its nanometer-scale pore structure, can be prepared with relatively low dielectric constants ("k"). Nanoporous silica is attractive because it employs similar precursors, including organic-substituted silanes, e.g., tetraethoxysilane ("TEOS"), as are used for the currently employed spin-on-glasses ("SOG") and chemical vapor disposition ("CVD") silica $SiO_2$. Nanoporous silica is also attractive because it is possible to control the pore size, and hence the density, material strength and dielectric constant of the resulting film material. In addition to a low k, nanoporous silica offers other advantages including: 1) thermal stability to 900° C., 2) substantially small pore size, i.e, at least an order of magnitude smaller in scale than the microelectronic features of the integrated circuit), 3) as noted above, preparation from materials such as silica and TEOS that are widely used in semiconductors, 4) the ability to "tune" the dielectric constant of nanoporous silica over a wide range, and 5) deposition of a nanoporous film can be achieved using tools similar to those employed for conventional SOG processing.

Thus, high porosity in silica materials leads to a lower dielectric constant than would otherwise be available from the same materials in nonporous form. In an additional advantage for nanoporous silica, additional compositions and processes may be employed in nanoporous silica, relative to a denser material. Other materials requirements include the need to have all pores substantially smaller than circuit feature sizes, the need to manage the strength decrease associated with porosity, and the role of surface chemistry on dielectric constant and environmental stability.

Density (or the inverse, porosity) is the key parameter of nanoporous silica that controls the dielectric constant of the material and this property is readily varied over a continuous spectrum from the extremes of an air gap at a porosity of 100% to a dense silica with a porosity of 0%. As density increases, dielectric constant and mechanical strength increase but the pore size decreases and vice versa. This suggests that the density range of nanoporous silica must be optimally balanced between for the desired range of low dielectric constant, and the mechanical properties acceptable for the desired application.

Nanoporous silica films have previously been fabricated by a number of methods, without achieving significant practical or commercial success. For example, nanoporous silica films have been prepared using a mixture of a solvent and a silica precursor, which is deposited on a substrate, e.g., a silicon wafer suitable for producing an integrated circuit, by conventional methods, e.g., including spin-coating and dip-coating. The substrate optionally has raised lines on its surface and preferably has electronic elements and/or electrical conduction pathways incorporated on or within its surface. The as-spun film is typically catalyzed with an acid or base catalyst and additional water to cause polymerization/gelation ("aging") and to yield sufficient strength so that the film does not shrink significantly during drying.

Another previously proposed method for providing nanoporous silica films was based on the observation that film thickness and density/dielectric constant can be independently controlled by using a mixture of two solvents with dramatically different volatility. The more volatile solvent evaporates during and immediately after precursor deposition. The silica precursor, typically partially hydrolyzed and condensed oligomers of TEOS, is applied to a suitable substrate and polymerized by chemical and/or thermal means until it forms a gel. The second solvent, called the Pore Control Solvent (PCS) is usually then removed by increasing the temperature until the film is dry. The second solvent is then removed by increasing the temperature. Assuming that no shrinkage occurs after gelation, the density/dielectric constant of the final film is fixed by the volume ratio of low volatility solvent to silica. EP patent application EP 0 775 669 A2, which is incorporated herein by reference, shows a method for producing a nanoporous silica film with uniform density throughout the film thickness.

Another method for producing nanoporous dielectrics is through the use of sol-gel techniques whereby a sol, which is a colloidal suspension of solid particles in a liquid, transforms into a gel due to growth and interconnection of the solid particles. One theory that has been advanced is that through continued reactions within the sol, one or more molecules within the sol may eventually reach macroscopic dimensions so that they form a solid network which extends substantially throughout the sol. At this point, called the gel point, the substance is said to be a gel. By this definition, a gel is a substance that contains a continuous solid skeleton enclosing a continuous liquid phase. As the skeleton is porous, the term "gel" as used herein means an open-pored solid structure enclosing a pore fluid.

Protecting the Surfaces of Nanometer Scale Pores

As the artisan will appreciate, a useful nanoporous film must meet a number of criteria, including having a dielectric constant ("k") falling within the required value range, having a suitable thickness ("t") (e.g., measured in angstroms), having an ability to effectively fill gaps on patterned wafers, and having an effective degree of hydrophobicity. If the film is not strong enough, despite achieving the other requirements, the pore structure may collapse, resulting in high material density and therefore an undesirably high dielectric constant. In addition, the surfaces of the resulting nano-scale pores carry silanol functional groups or moieties. Silanols, and the water that can be adsorbed onto the silanols, are highly polarizable and will raise the dielectric constant of the film. Thus, the requirement for hydrophobicity arises from the requirement for a reduced range of dielectric constant relative to previously employed materials.

Previous attempts to solve this problem and to provide hydrophobic nanoporous films free of silanols and adsorbed water have employed the process of silylation, which is the derivatization of a surface with a capping reagent, e.g., trimethylsilyl [TMS, $(CH_3)_3SiO-$]. However, previous silylation processes have not been successful in achieving the desired hydrophobic properties for nanoporous silica.

In one such failed method, the wet nanoporous silica film was subjected to the additional step of exposing the film to a liquid mixture of solvent and a surface modification agent suitable for silylating the pore surface, e.g., hexamethyldisilazane [HMDZ, $(CH_3)_3SiNHSi(CH_3)_3$]. The purpose of the solvent is to both carry the agent, e.g., HMDZ, inside the nano-scale pores and into the pore volume, as well as providing the additional advantage of lowering the surface tension of the pore fluid before drying, thus avoiding mechanical stresses on the pore structure. The aim was for the surface modification agent to render the surfaces of the nano-scale pore structures hydrophobic by capping the silanols in the film with a hydrophobic moiety, e.g., by means of the reactions illustrated by Equations 1 and 2:

$$2SiOH + R_3SiNHSiR_3 \rightarrow 2SiOSiR_3 + NH_3 \quad \text{Equation 1:}$$

$$SiOH + R_3SiOH \rightarrow SiOSiR_3 + H_2O \quad \text{Equation 2:}$$

wherein each "R" is independently selected and is, e.g., H, any alkyl, aryl, alkylaryl and so forth, e.g., methyl, ethyl, phenol and any other suitable art-known moiety, provided that the capped silanols, i.e, the $SiOSiR_3$ moieties, provide a film with effective hydrophobicity while avoiding any significant undesirable changes to other film parameters. In a more specific example, silylation may be accomplished by employing the following reaction, shown by Equation 3 below:

$$(CH_3)_3SiNHSi(CH_3)_3 + 2SiOH \leftrightarrows 2 \equiv SiOSi(CH_3)_3 + NH_3 \quad \text{Equation 3:}$$

By capping the silanols so that the surface of the dried nanoporous silica is rendered hydrophobic, it was intended that the silanols be removed and that the adsorption of atmospheric moisture into the porous surface be prevented, thereby providing a lower and more stable range for the dielectric constant of the resulting nanoporous film product.

However, this process suffers from a number of difficulties. For example, when the capping reaction has been conducted on the gelled film using previously available liquid reagents, the process has required a second coater (or halved throughput on a single coater track) and a large excess of solvent/surface modification agent, all of which generates significant waste. In addition, this previous process is known to increase the impurity level in the final film product and fails to provide surfaces with a sufficient degree of silylation, resulting in a nanoporous film that is not sufficiently hydrophobic to prevent undesirable increases in the dielectric constant caused by adsorbed atmospheric moisture.

Other previous attempts to silylate pore surfaces of nanoporous films have included, conducting the silylation reaction before deposition of the film onto a substrate, but that has resulted in films of lower mechanical strength and reduced dielectric constant stability in the presence of atmospheric moisture. Since post-deposition surface modification yields the best film properties, that approach is preferred.

Thus, there remains a need in the art for new processes which eliminate all of the aforementioned problems, as well as overcoming other obstacles to the use of nanoporous silica in the fabrication of integrated circuits.

SUMMARY OF THE INVENTION

In order to solve the above mentioned problems and to provide other improvements, the invention provides new methods for effectively silylating nanoporous silica films to a desired range of dielectric constant significantly lower than has previously been obtained. The improved silylation processes provided herein allow for production of nanoporous silica films that are sufficiently hydrophobic to avoid moisture adsorption and to provide dielectric constant values that are both low and stable, while retaining other desirable characteristics required in the production of integrated circuits.

Thus, in one embodiment, the invention provides for an improved vapor-phase silylation process wherein the surface modification agent, e.g., silylation agent, is employed in a vapor-phase and optionally with a co-reactant and/or co-solvent. In another embodiment, the invention provides for an improved dual phase liquid-based silylation process wherein the surface modification agent, e.g., silylation agent, is employed in solution in combination with a ketone co-solvent.

The vapor phase and solution based processes according to the invention are conducted by treating a suitable nanoporous silica film, that has a pore structure with hydrophilic pore surfaces, and that is present on a substrate. The nanoporous silica film is optionally prepared on the substrate immediately prior to the time of treatment, or may be pre-prepared and stored or obtained from another source. It should also be mentioned that the nanoporous silica films to be treated by the vapor phase or solution based processes of the invention are optionally aged before or after conducting the inventive treatment, but preferably the film is aged prior to conducting the silylation reaction.

The vapor phase processes are conducted by reacting the nanoporous silica film with a vapor phase material that includes an effective amount of a surface modification agent and optionally a co-reactant or co-solvent, for a period of time sufficient for the surface modification agent to penetrate the pore structure and produce a nanoporous silica film having a dielectric constant of about 3 or less.

The solution-based processes according to the invention are conducted by reacting the nanoporous silica film with an effective amount of a reaction solution that includes a mixture of an effective amount of a surface modification agent, together with an effective amount of a ketone co-solvent. the reaction is conducted for a period of time sufficient for reaction solution to penetrate the pore structure and produce a nanoporous silica film having a dielectric constant of about 3 or less.

The invention also provides for nanoporous silica films that are hydrophobic and/or that have moisture stable dielectric constants of 3 or less. The invention also provides for integrated circuits that include one or more such nanoporous silica films treated by the vapor phase and liquid phase processes of the invention.

In one aspect of the invention, the surface modification agent employed in the processes of the invention, for both the vapor phase and the solution based processes of the invention, is a compound having one of the following formulas: $R_3SiNHSiR_3$, $R_xSiCl_y$, $R_xSi(OH)_y$, $R_3SiOSiR_3$, $R_xSi(OR)_y$, $M_pSi(OH)_{[4-p]}$, $R_xSi(OCOCH_3)_y$ and combinations thereof, wherein x is an integer ranging from 1 to 3, y is an integer ranging from 1 to 3, p is an integer ranging from 2 to 3, each R is an independently selected hydrophobic organic moiety, each M is an independently selected hydrophobic organic moiety; and R and M can be the same or different and are independently organic moieties consisting of alkyl, aryl and/or combinations thereof. Optionally, the aryl is not a heteroaryl group.

In a further aspect of the invention, the alkyl moiety of the surface modification agent, for both the vapor phase and solution based processes of the invention, is substituted or unsubstituted and can be straight alkyl, branched alkyl, cyclic alkyl and combinations thereof, and can range in size from $C_1$ to about $C_{18}$. Analogously, the aryl moiety is substituted or unsubstituted and can range in size from $C_5$ to about $C_{18}$.

Thus, simply by way of example, the surface modification agent for both the vapor phase and solution based processes of the invention, is one of the following: trimethylethoxysilane, trimethylmethoxysilane, 2-trimethylsiloxypent-2-ene-4-one, n-(trimethylsilyl) acetamide, 2-(trimethylsilyl) acetic acid, n-(trimethylsilyl) imidazole, trimethylsilylpropiolate, trimethylsilyl (trimethylsiloxy)-acetate, nonamethyltrisilazane, hexamethyldisilazane, hexamethyldisiloxane, trimethylsilanol, triethylsilanol, triphenylsilanol, t-butyldimethylsilanol, diphenylsilanediol, and combinations thereof.

In another preferred aspect of the invention the surface modification agent is an alkylacetoxysilane or arylacetoxysilane compound, e.g., acetoxysilane, acetoxytrimethylsilane, methyltriacetoxysilane, phenyltriacetoxysilane, diacetoxydimethylsilane, diacetoxydiphenylsilane, and combinations of these and/or in combination with any of the foregoing surface modification agents.

In another preferred aspect of the invention, the surface modification agent for both the vapor and solution based processes of the invention is hexamethyldisilazane.

In yet another aspect of the invention, the vapor phase processes of the invention are conducted with one or more co-solvents and/or co-reactants, e.g., including but not limited, ketone co-solvents or co-reactants. Simply by way of example, the co-reactants and co-solvents are selected from among the following compounds: cyclopentanone, diisopropylketone, 2,4- pentanedione, dioxane, n-butanol, 2-pentanol, 1,2-diaminopropane, 1-dimethylamino-2 propanone, water, and combinations thereof.

In a further aspect of the invention, one or more ketone co-solvent(s) for the solution-based processes of the invention are selected from among the following compounds, which are provided simply by way of example: acetone, 2-butanone, 2-pentanone, 3-pentanone, 2,4-dimethyl-3-pentanone, cyclopentanone, cyclohexanone, and combinations thereof

BRIEF DESCRIPTION OF THE DRAWINGS

FIG. 3 is an instrument chart of infrared ("IR") absorbance verses wavelength, in $cm^{-1}$ for nanoporous films prepared using HMDZ mixed with 2,4-dimethyl-3-pentanone, acetone, 3-pentanone and 2-pentanone, respectively.

DETAILED DESCRIPTION OF THE PREFERRED EMBODIMENT

Figure 1:
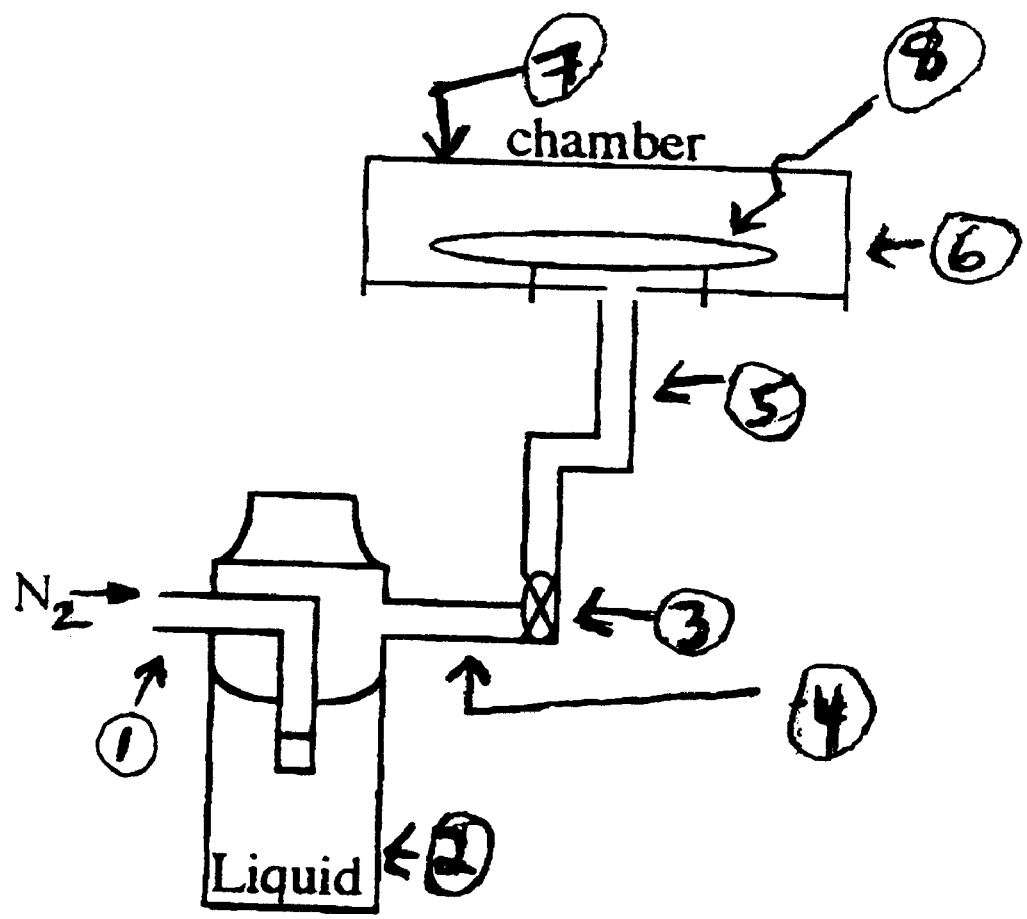
FIG. 1 is a schematic representation of an $N_2$/HMDZ flow apparatus.

A number of methods for the preparation of nanoporous silica films on substrates are known to the art, as summarized in the "Description of the Prior Art", above. Such substrates optionally have raised lines on the surface receiving the nanoporous film and preferably are suitable for the production of integrated circuits, e.g., with optional electronic elements and conduction pathways placed under, over and/or adjacent to the nanoporous film. In addition, a number of variations and improvement to these generally known methods for the preparation of nanoporous films are taught by co-owned U.S. patent application Ser. Nos., 09/046,475 and 09/046,473, both filed on Mar. 25, 1998; U.S. patent application Ser. No. 09/054,262, filed on Apr. 3, 1998; and U.S. patent application Ser. Nos. 09/055,244 and 09/055,516, both filed on Apr. 6, 1998, the disclosures of which are incorporated by reference herein in their entireties.

Nanoporous silica films formed on a substrate for use according to the invention are generally formed with a pore size that ranges from about 1 nm to about 100 nm, more preferably from about 2 nm to about 30 nm, and most preferably from about 3 nm to about 20 nm. The density of the silicon containing composition, including the pores, ranges from about 0.1 to about 1.9 $g/cm^3$, more preferably from about 0.25 to about 1.6 $g/cm^3$, and most preferably from about 0.4 to about 1.2 $g/cm^3$.

Whatever methods are employed for forming the nanoporous silica film, the instant invention provides processes for converting the starting nanoporous silica film into one that has a stable and low dielectric constant suitable for use in producing integrated circuits having features of 0.25 $\mu$m, or less while avoiding the undesirable effects of interconnect RC delay, power consumption and signal cross-talk. Further, in contrast to previous efforts, the nanoporous film according to the invention has sufficient hydrophobicity to substantially avoid or entirely eliminate the negative effects produced by the adsorption of moisture into the nanometer scale pores of the film, while preserving other desirable features of this material.

Thus, the nanoporous silica films produced by the processes of the invention preferably have a moisture stable dielectric constant that is less than about 3. More preferably, the nanoporous silica films of the invention have a dielectric constant ranging from about 1.1 to about 3.0, even more preferably from about 1.3 to about 3.0, and most preferably from about 1.5 to about 2.5.

The starting materials for conducting the processes of the invention include a nanoporous silica film formed on a suitable substrate by art-known methods, e.g., by spinning a precursor material onto a suitable substrate and then aging the film, for example, by treating the coated substrate with, e.g., ammonia and water vapor, to promote gelation. Generally, the processes of the invention are conducted on the nanoporous film while it is still wet film, directly after aging. In alternative embodiments, the processes of the invention are optionally conducted on nanoporous silica films not yet subjected to aging, to dried nanoporous films and to nanoporous silica films that have been stored for a time period after completing the aging process.

Thus, in one embodiment, the invention provides for a vapor-phase silylation process wherein the surface modifying agent is employed in a vapor-phase. In another embodiment, the invention provides for an improved liquid phase liquid-based silylation process wherein the surface modification agent is employed in a solution form in combination with a ketone co-solvent. Both processes share the common feature of contacting the nanoporous silica film with a fluid, in either liquid or vapor phase, that will penetrate the silica film surface into the nano-scale pore structure and react with the surface of the pores to produce the desired material properties. So that the artisan will better appreciate the nature of the invention, the particular embodiments are separately described in greater detail in Sections A and B, respectively, as follows.

A. Vapor-Phase Surface Modification

In one embodiment of the invention, it has now surprisingly been found that when a nanoporous silica film is exposed to a vapor phase material that includes a vapor-phase surface modification agent, and an optional carrier gas, under suitable conditions, silanol moieties on the pore surfaces of the treated nanoporous film are effectively silylated. Any art-known compound effective for capping the silanols in the nanoporous film to be treated may be employed in the processes of the invention as a surface modification agent. Of course, a suitable surface modification agent must be useful when applied in the vapor or gas state, under conditions favorable to conducting the desired silylation reaction, e.g., as described above.

It will be appreciated that a suitable surface modification agent may be selected from a wide range of compounds which exhibit satisfactory boiling point/vapor pressure, reactivity, purity, and which yield an effective and heat stable hydrophobic surface on the treated film without causing significant undesirable effects. Desirable surface modification agents will have vapor pressures suitable for conducting a vapor phase reaction according to the invention. For example, the vapor pressure of a suitable surface modification agent will range from about 1 to about 500 torr. Preferably, the vapor pressure of a suitable surface modification agent will range from about 5 to about 100 torr. More preferably, the vapor pressure of a surface modification agent will range from about 5–100 torr. Most preferably, the vapor pressure of a surface modification agent will range from about 10 to about 50 torr.

The artisan will appreciate that any suitable art-known silylation agent may be employed in the processes of the invention in combination with a ketone co-solvent. Such a silylation agent includes, but is not limited to, a compound having the following formula: $R_3SiNHSiR_3$, $R_xSiCl_y$, (chlorosilanes), $R_xSi(OH)_y$ (alkylsilanol or arylsilanol), $R_3SiOSiR_3$ (disiloxanes), or $R_xSi(OR)_y$ (alkylalkoxysilanes), $R_xSi(OCOCH_3)_y$ (alkylacetoxysilanes or arylacetoxysilanes).

In preferred embodiments, x is an integer ranging from 1 to about 3, and y is an integer ranging from 1 to about 3. Further, each "R" is independently selected and may be the same or different. Further, when R is alkyl, the alkyl moiety is optionally substituted or unsubstituted, and may be straight, branched or cyclic, and preferably ranges in size from $C_1$ to about $C_{18}$, or greater, and more preferably from $C_1$ to about $C_8$. When R is aryl, the aryl moiety preferably consists of a single aromatic ring that is optionally substituted or unsubstituted, and ranges in size from $C_5$ to about $C_{18}$, or greater, and more preferably from $C_5$ to about $C_8$. In a further option, the aryl moiety is not a heteroaryl.

Thus, each R is independently any suitable alkyl, aryl, alkylaryl and the like, e.g., methyl, ethyl, propyl, butyl, and derivatives and combinations thereof, and any other suitable art-known organic moiety, provided that the capped silanols, i.e., the $SiOSiR_3$ moieties, result in a film with effective hydrophobicity, without causing any significant undesirable changes to other film parameters.

Surface modification agents useful according to the invention include, e.g., silylation agents such as acetoxytrimethylsilane, trimethylethoxysilane, trimethylmethoxysilane, 2-trimethylsiloxypent-2-ene-4-one, n-(trimethylsilyl)acetamide, 2-(trimethylsilyl) acetic acid, n-(trimethylsilyl)imidazole, trimethylsilylpropiolate, trimethylsilyl(trimethylsiloxy)-acetate, nonamethyltrisilazane, hexamethyldisilazane, hexamethyldisiloxane, methyltriacetoxysilane, as well as organosilanols, and combinations thereof.

Preferably, the surface modification agent will also include an alkylacetoxysilane or arylacetoxysilane compound, e.g., acetoxysilane, acetoxytrimethylsilane, diacetoxydimethylsilane, methyltriacetoxysilane, phenyltriacetoxysilane and diphenyldiacetoxysilane and combinations thereof and/or in combination with any of the foregoing surface modification agents.

Thus, in an optional embodiment of the invention organosilanols are usefully employed as surface modification agents. As surface modification agents, organosilanols provide the additional advantages, relative to the other mentioned surface modification agents, that they are more stable in the presence of solvents, relative to compounds such as HMDZ, and are also relatively more stable in the presence of water. This later property is particularly advantageous when treating a nanoporous film with a vapor-phase surface modification agent. This later property is particularly advantageous relative to a vapor-phase surface modification agent that is reactive with water. Otherwise, precautions must be taken to avoid water vapor contamination which could lead to an unwanted reaction, e.g., production of ammonia gas and pressure damage to the reaction chamber. When organosilanols are employed, water vapor contamination is not a serious concern.

Organosilanol compounds useful in the processes of the invention include those having the formula:

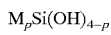

$M_pSi(OH)_{4-p}$ wherein p is 2 or 3 wherein M is an organic moiety and each M is independently selected and may be the same or different. When M is alkyl, the alkyl moiety is optionally substituted or unsubstituted, and may be straight, branched or cyclic, and preferably ranges in carbon content from $C_1$ to about $C_{18}$, or greater, and more preferably from $C_1$ to about $C_8$. When M is aryl, the aryl moiety preferably consists of a single aromatic ring that is optionally substituted or unsubstituted, and ranges in size from about $C_5$ to about $C_{18}$, or greater, and more preferably from about $C_5$ to about $C_8$.

Thus, each M is independently any suitable alkyl, aryl, alkylaryl and the like, e.g., methyl, ethyl, propyl, butyl, and derivatives and combinations thereof, and any other suitable art-known organic moiety, provided that the capped silanols result in a film with effective hydrophobicity, without causing any significant undesirable changes to other film parameters.

In a preferred embodiment, exemplary organosilanol surface modification agents according to the invention include, e.g., trimethylsilanol, triethylsilanol, triphenylsilanol ($C_{18}H_{16}OSi$), t-butyldimethylsilanol ($C_6H_{16}OSi$), diphenylsilanediol ($C_{12}H_{12}O_2Si$).

In yet another embodiment of the invention, the vapor-phase reaction may optionally be conducted with a co-solvent and/or co-reactant. Preferably, the co-solvent has a boiling point that is similar to that of the reactive solvent, e.g., HMDZ, and is selected to improve the miscibility of the surface modification agent with the pore fluid. This allows faster diffusion into the nano-scale pores of the silica film, and improves the silylation reaction yield on the surface of the pores. A co-reactant or co-solvent suitable for use in the processes of the invention will have a vapor pressure, for example, ranging from about 1 to about 500 torr, preferably ranging from about 10 to about 100 torr and most preferably ranging from about 50 to about 200 torr.

In a preferred embodiment, the reaction is conducted with a vapor phase material that comprises a surface modification agent and a carrier gas, and the surface modification agent is preferably present in an amount ranging from about 0.1 to about 50 mole percent relative to the carrier gas and any other constituents, e.g; a co-solvent and/or co-reactant, of the vapor phase material.

When a vapor-phase co-reactant is employed, it is, for example, one that will react with the surface modification agent, such as HMDZ, to form a further reactive species. For HMDZ, the co-reactant is preferably selected so that the formed reactive species is trimethylsilanol, or its amine derivative, either of which can react with surface silanols (Si—OH's) to cap the pore surface. The equations below illustrate the reaction of HMDZ with $H_2O$ and surface silanols. Equation 4 shows HMDZ reacting with water to form trimethylsilanol and trimethylsilylamine; equation 5 shows trimethylsilanol reacting with silanols on a pore surface; and equation 6 shows trimethylsilylamine reacting with silanols on a pore surface.

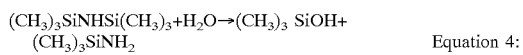
Equation 4:

Equation 5:

Equation 6:

The artisan will also appreciate that the co-reactant and co-solvent methods are optionally combined to provide both improved miscibility of the reactant with the pore fluid, as well as enhancing the reactability of the surface modification agent, e.g., HMDZ. In particular, ketone reagents have both co-reactant and co-solvent properties that enhance the silylation reaction, due to their ability to self-react and form slight amounts of water, which in turn increases the reactivity of HMDZ (the amount of water formed is too small to cause an excessive reaction and overpressure in the reaction vessel). Exemplary co-solvents and co-reactants are listed in Table 1, below:

TABLE 1

Exemplary Co-reactants and Co-solvents for Vapor-phase Silylation

| Co-solvent | Co-reactant | Boiling Point (° C.) | Range of solvent in HMDZ (vol %) |
|---|---|---|---|
| Cyclopentanone ($C_5H_8O$) | Cyclopentanone ($C_5H_8O$) | 130° C. | 25–95% |
| Diisopropylketone ($C_7H_{14}O$) | Diisopropylketone ($C_7H_{14}O$) | 124° C. | 25–95% |
| 2,4-Pentanedione ($C_5H_8O_2$) | 2,4-Pentanedione ($C_5H_8O_2$) | 138° C. | 25–95% |
| Dioxane ($C_4H_8O_2$) | | 101° C. | 25–95% |
| | Water | 100° C. | <5% |
| n-Butanol ($C_4H_8O_2$) | | 117° C. | 25–95% |
| 2-Pentanol ($C_5H_{12}O$) | | 119° C. | 25–95% |
| | 1,2-Diaminopropane ($C_3H_9N_2$) | 119° C. | 25–95% |
| | 1-Dimethylamino-2-propanone ($C_4H_{10}NO$) | 121–127° C. | 25–95% |

In further embodiments of the invention, depending upon the final desired film thickness and refractive index, the vapor-phase surface modification reaction may be conducted before or after drying of the film on a substrate. It will also be appreciated that the vapor-phase reaction may be conducted by any suitable method and employing any appropriate apparatus. For example, in one embodiment, a flowing carrier gas stream is employed to carry the modification agent, in vapor form, into contact with a film-bearing substrate to be treated at a temperature favorable to the silylation reaction. The reaction is preferably enclosed in a suitable flow chamber or apparatus. One such apparatus is illustrated, simply by way of example, by FIG. 1.

Referring to FIG. 1, a carrier gas, e.g., an inert gas such as $N_2$ gas, passes through inlet (1) to enter a vaporization chamber (2) containing a vaporizable surface modification agent or mixtures thereof, e.g., HMDZ. The gas/vapor mixture is produced in the vaporization chamber by any art-known means, including, e.g., by heating, blowing the carrier gas over the liquid phase, evaporation from a wicking material, atomization, and the like. The resulting gas/vapor mixture is moved by pump (3), or optionally flows under positive pressure from the carrier gas source, through outlet conduit (4) to enter reaction chamber inlet conduit (5) and passes into a substantially closed reaction chamber (7) in which a film-bearing substrate is suitably supported, e.g., on platform (8). Optionally, the flowing vapor/gas mixture is thereafter vented to a recovery facility (not illustrated) wherein the surface modification agent is condensed for recycling and/or disposal. Alternatively, the vapor/gas circulation circuit may be fully or partially closed, so that the vapor/gas will be repeatedly circulated through the reaction chamber during the reaction process.

Of course, the artisan will appreciate that any suitable art known carrier gas that is compatible with the reaction processes may be employed, including, simply by way of example, the noble gases such as helium, argon, xenon, or other relatively inert gases such as carbon dioxide and the previously mentioned nitrogen.

In another embodiment of the invention, a film-bearing substrate is treated in a static chamber wherein the atmosphere has been previously evacuated and the surface modification agent subsequently introduced into the chamber for a period of time and under conditions favorable to effective silylation to render the film surface hydrophobic. Alternatively, a film-bearing substrate is placed on a stand in a closed or covered chamber having a sufficient quantity of liquid surface modification agent at the bottom. When the surface modification agent evaporates it will diffuse into the film surface and render it hydrophobic.

The surface modification reaction is conducted generally by contacting a film to be treated with a suitable surface modification agent in vapor form, followed by heating for a relatively brief period or periods at an elevated temperature. Film is treated before, during or after the aging process but preferably, the nanoporous film is aged prior to treatment with a suitable surface modification agent. Thus, the film is contacted with the surface modification agent at a suitable temperature and for a duration sufficient to render the treated film effectively hydrophobic. Generally, the film is contacted with the reagent and the reaction is run at or about room temperature (e.g., 20–30° C.), for a time period sufficient to allow the agent to diffuse into the pores and to undergo the modification reaction at the internal surface of the pores. Thus, the reaction time period is selected for the optimal process results, but generally ranges from about 5 minutes to about 6 hours, during which time the film remains in contact with the surface modification agent. Preferably, the film remains in contact with the agent for about 30 minutes.

Thereafter, the treated film is dried by heating in air for one or more time periods, ranging from about 5 seconds to about 10 minutes each, but preferably for about 1 minute for each heat treatment. The heating steps serve to drive remaining vapor phase material, e.g., surface modification agent, from the reaction step out of the pores. The number of heat treatments generally ranges from about 1 to about 5, but preferably two heat treatments are conducted, second heat treatment at a higher temperature than the first to ensure removal of the agent, while minimizing thermal stress on the film. The heat treatment is generally conducted at temperatures ranging from about 100 through about 400° C., or greater, and more preferably from about 150 to about 350° C. In particular, the first heat treatment is preferably conducted at a temperature ranging from about 150 to 200° C., and the second heat treatment is preferably conducted at a temperature ranging from about 250 to about 350° C.

B. Liquid-Phase Surface Modification with a Ketone Cosolvent

Surprisingly, it has now been discovered that liquid phase surface modification in the presence of a ketone co-solvent allows for production of nanoporous films that are effectively hydrophobic without previously observed undesirable effects on other film properties. Thus the processes of the invention include a solution based process employing a reaction solution that includes, e.g., both a surface modification agent and a ketone solvent.

The disadvantages of the previous methods and the advantages of the inventive processes are highlighted by the following illustration. A wafer was coated with precursor and, after aging in the usual way, the treated wafer is centered on the spin-coater. The film was then spun at a low speed, e.g. ~250 rpm. A mixture of ketone/HMDZ was then deposited onto the center of the film at the required rate, e.g., about 2 cc/sec for a 4 inch wafer. A minimum of 10 cc is required, typically up to 30 cc. Immediately after the solvent exchange process was completed the film was spun dry on the chuck. Solvent exchange works best when the mixture is preheated to >30° C. For a k=1.3 PCS#3 film, a good film can be obtained using any concentration from 15/85 to 85/15 vol % mixtures of acetone/HMDZ.

As illustrated by Table 2, below, after 20 minutes, even though the refractive index ("Nf") has decreased to 1.095, the film is still partially wetted by a drop of water, i.e., the film is still partially hydrophilic. Direct solvent exchange with liquid HMDZ not only silylates the pore surface but simultaneously washes away the higher surface tension porosity control solvent (PCS). Nevertheless, the extent of silylation is less complete, so that the produced film is somewhat less hydrophobic than is a film that is silylated using vapor-phase HMDZ (Table 2). Nevertheless, the extent of the reaction is believed to be sufficient to provide a stable and low dielectric constant ("k") of this material, e.g., having a k ranging from about 1.3 to about 3.

TABLE 2

Typical properties of k = 1.3 PCS#3 films silylated under different conditions.

| Silylating Conditions | Refractive Index Nf | Thickness t (Å) | Is film hydrophobic to a water drop |
|---|---|---|---|
| 1 min HMDZ vapor | 1.170 | 3500 | no |
| 2 min HMDZ vapor | 1.150 | 3700 | no |
| 20 min HMDZ vapor | 1.095 | 7300 | partially |

TABLE 2-continued

Typical properties of k = 1.3 PCS#3 films silylated under different conditions.

| Silylating Conditions | Refractive Index Nf | Thickness t (Å) | Is film hydrophobic to a water drop |
|---|---|---|---|
| HMDZ liquid | 1.120 | 5300 | partially |
| 50/50 mixture of liquid Acetone/HMDZ | 1.090 | 9100 | yes |

Thus, the final column of Table 2 confirms the unexpected discovery that liquid phase silylation works much more effectively when a ketone, as opposed to any other organic solvent, is used as the cosolvent to treat a nanoporous silica film, is confirmed. In particular, among these examples, note that only the film that was silylated with 50/50 acetone/HMDZ is fully hydrophobic.

Any suitable art-known ketone may be employed in the methods of the invention, Table 3, below, lists a number of ketones, with a wide range of boiling points, molecular weights and surface tensions, which have been successfully used as silylation cosolvents with HMDZ. Of course, the artisan will appreciate that the following list of ketones is merely exemplar, and that these and any other suitable ketones may be readily employed in the inventive processes, separately or in any combination, as desired.

TABLE 3

Ketones and their Properties.

| Solvent | Formula | Boiling point (° C.) | Molecular weight |
|---|---|---|---|
| Acetone (2-propanone) | $CH_3COCH_3$ | 58.08 | 56 |
| 2-butanone | $CH_3COC_2H_5$ | 80 | 72.11 |
| 2-pentanone | $CH_3COC_3H_7$ | 100 | 86.13 |
| 3-pentanone | $C_2H_5COC_2H_5$ | 102 | 86.13 |
| 2,4-dimethyl-3-pentanone | $(CH_3)_2CHCO$—$CH(CH_3)_2$ | 124 | 114.19 |
| cyclopentanone | $C_5H_8(=O)$ | 131 | 84.12 |
| cyclohexanone | $C_6H_{10}(=O)$ | 155 | 98.15 |

In a preferred embodiment of the invention, the above-described ketones are ultrapurified to minimize impurities and contamination, particularly by heavy metals. Processes for providing ultrapurified ketones are readily available to the art and include distillation using noncontaminating condensers, e.g., triple distillation in glass or ceramic-based equipment, reverse osmosis, ion exchange resin filtration to remove heavy metal ions, and combinations thereof Ultrapurified ketones useful for the invention will have no more than 0.1 parts per billion of heavy metal contaminants.

In another preferred embodiment, the reaction solution is prepared from a surface modification agent and a ketone cosolvent in a ratio that ranges from about 10:90 to about 90:10 parts of surface modification agent to ketone cosolvent, by volume. In a more preferred embodiment, the ratio of surface modification agent to ketone in the reaction solution is about 50:50, by volume.

Table 4, below, lists other organic solvents, both protic and aprotic, which, when used as silylation cosolvents, were no better or worse than HMDZ used on its own and significantly worse than ketone-HMDZ mixtures.

TABLE 4

Ineffective Organic solvents, and their Properties

| Solvent | Formula | Boiling point (° C.) | Molecular weight |
|---|---|---|---|
| 1,4 dioxane | $C_4H_8O_2$ | 101 | 88.11 |
| 1,3 dioxalane | $C_3H_6O_2$ | 74 | 74.08 |
| ethanol | $C_2H_5OH$ | 78 | 46.07 |
| isopropanol | $(CH_3)_2CHOH$ | 82 | 60.10 |
| tert-butanol | $(CH_3)_3COH$ | 83 | 74.12 |
| PGMEA* | $(CH_3)_2CH_2CHCOO$ | 145 | 132.16 |

(*Propylene glycol methyl ether acetate)

The artisan will appreciate that any suitable art-known silylation agent may be employed in the processes of the invention in combination with a ketone co-solvent. Such a silylation agent includes, but is not limited to, a compound having the following formula: $R_3SiNHSiR_3$, $R_xSiCl_y$, (chlorosilanes), $R_xSi(OH)_y$ (alkylsilanol), $R_3SiOSiR_3$ (disiloxanes), or $R_xSi(OR)_y$(alkylalkoxysilanes) $R_xSi(OCOCH_3)_y$ (alkylacetoxysilanes or arylacetoxysilanes).

In preferred embodiments, x is an integer ranging from 1 to about 3, and y is an integer ranging from 1 to about 3. Further, each "R" is independently selected and may be straight, branched or cyclic, and preferably ranges in size from $C_1$ to about $C_{18}$, or greater, and more preferably from $C_1$ to about $C_8$. When R is aryl, the aryl moiety preferably consists of a single aromatic ring that is optionally substituted or unsubstituted, and ranges in size from $C_5$ to about $C_{18}$, or greater, and more preferably from $C_5$ to about $C_8$.

Thus, each R is independently any suitable alkyl, aryl, alkylaryl and the like, e.g., methyl, ethyl, propyl, butyl, and derivatives and combinations thereof, and any other suitable art-known organic moiety, provided that the capped silanols, i.e., the $SiOSiR_3$ moieties, result in a film with effective hydrophobicity, without causing any significant undesirable changes to other film parameters.

In one embodiment, exemplary surface modification agents according to the invention include, e.g., hexamethyldisilazane, acetoxytrimethylsilane, trimethylethoxysilane, triethylmethoxysilane, 2-trimethylsiloxypent-2-ene-4-one, n-(trimethylsilyl) acetamide, 2-(trimethylsilyl) acetic acid, n-(trimethylsilyl) imidazole, trimethylsilylpropiolate, trimethylsilyl (trimethylsiloxy)-acetate, nonamethyltrisilazane, hexamethyldisiloxane, methyltriacetoxysilane, organosilanols, an d combinations thereof.

Organosilanol compounds useful in the processes of the invention include those having the formula:

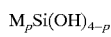

$$M_pSi(OH)_{4-p}$$

wherein p is 2 or 3
and wherein M is an organic moiety and each M is independently selected and may be the same or different. When M is alkyl, the alkyl moiety is optionally substituted or unsubstituted, and may be straight, branched or cyclic, and preferably ranges in carbon content from $C_1$ to about $C_{18}$, or greater, and more preferably from $C_1$ to about $C_8$. When M is aryl, the aryl moiety preferably consists of a single aromatic ring that is optionally substituted or unsubstituted, and ranges in size from about $C_5$ to about $C_{18}$, or greater, and more preferably from about $C_5$ to about $C_8$.

Thus, each M is independently any suitable alkyl, aryl, alkylaryl and the like, e.g., methyl, ethyl, propyl, butyl, and derivatives and combinations thereof, and any other suitable art-known organic moiety, provided that the capped silanols result in a film with effective hydrophobicity, without causing any significant undesirable changes to other film parameters.

Preferably, the surface modification agent will also include an alkylacetoxysilane or arylacetoxysilane compound, e.g., acetoxysilane, acetoxytrimethylsilane, diacetoxydimethylsilane, methyltriacetoxysilane, phenyltriacetoxysilane and diphenyldiacetoxysilane and combinations thereof and/or in combination with any of the foregoing surface modification agents.

In a further embodiment of the inventive process, following solvent exchange and the spin-dry process step, the reacted films were then dried by heating in air for one or more time periods, ranging from about 5 seconds to about 10 minutes each, but preferably for about 1 minute for each heat treatment in order to drive remaining surface modification agent out of the pores. The number of heat treatments generally ranges from about 1 to about 5, but preferably two heat treatments are conducted with the second heat treatment at a higher temperature than the first to ensure removal of the surface modification agent together with the cosolvent, while minimizing thermal stress on the film. The heat treatment is conducted at temperatures ranging from about 100 through about 400° C., or greater, and more preferably from about 150 to about 350° C. In particular, the first heat treatment is preferably conducted at a temperature ranging from about 150 to 200° C., and the second heat treatment is preferably conducted at a temperature ranging from about 250 to about 350° C.

C. Film Surface Hydrophobicity

1. Hydrophobicity And Dielectric Constant

For the sake of simplicity and convenience, most of the Examples provided below measure the success of the surface treatment of the nanoporous silica films of the invention by qualitatively measuring the hydrophobicity of the produced film. Without being bound by any theory or hypothesis, this is considered to provide a useful and relative comparison of the films produced by various methods because the degree to which the produced film is hydrophobic is believed to be an effective measure of the proportion of silanol moieties that are silylated on the pore surfaces of the film. This in turn provides a marker for successful production of the desired films of low dielectric constant. For example, as shown in the Examples below, a contact angle ranging from about 45 to about 90 degrees indicates that such a film has been sufficiently treated so that it has the desired hydrophobic properties.

It should be appreciated, however, that the determinations of the hydrophobic properties of the produced films are of greatest significance when comparing different reaction processes employing surface modification agents that are themselves of the same degree of hydrophobicity. Thus, the exemplary nanoporous silica films treated with HMDZ, will generally show higher measures of hydrophobicity, all else being equal, than will films treated with, e.g., MTAS, as confirmed by the Examples provided below.

2. Determining Hydrophobic Properties of Produced Films

For the convenience of the reader, the following discussion of "contact angle" is provided so that the advantages of the inventive processes may be fully appreciated. In order to confirm the successful treatment of the pore surfaces of nanoporous films, a method of estimating the hydrophobicity of each film surface is desirable. One such method, simply by way of example, is to measure the "contact angle"

of a water drop placed on a surface to be tested. The contact angle provides a qualitative measure of relative hydrophobicity by showing how well or poorly a drop of water wets or spreads the surface of the film. Compared to a water droplet on a hydrophobic surface, a drop of water on a substrate surface with poor hydrophobic properties forms a low and wide dome over such a surface. The contact angle measurements thus provides an estimate of the degree of curvature of a water drop on a test surface and serves to provide a qualitative measure of the surface hydrophobicity.

Figure 2:
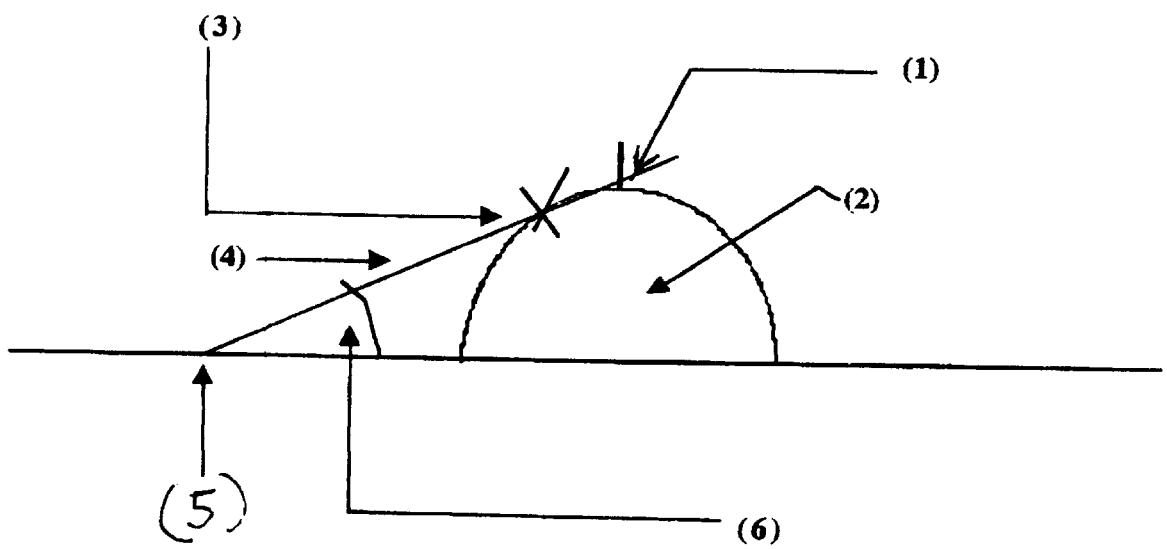
FIG. 2 is a diagram illustrating the measurement of a "contact angle" in the determination of relative hydrophobicity of produced nanoporous films.

With reference to FIG. 2, a typical "contact angle" measurement is conducted by placing a water droplet on a film to be tested. The film to be tested is on a substrate that is mounted so that the tested film is fully horizontal and parallel to the Earth's surface. A vertical marking surface, e.g., a cardboard, plastic or paper surface, is placed so that the droplet is between the vertical surface and the observer. The contact angle of each water drop is then measured by observing the water drop from the side and by then marking the vertical surface behind the center top (1) of the water drop (2). A second mark is then placed on the left or right side of the highest curvature point on the drop (3). A straight line (4) is then drawn through the marks to the surface of the film (5) and the angle (6) can then be measured. The values described in the examples are approximated because they were only qualitatively measured using this technique.

The following non-limiting examples serve to further explain and illustrate the invention.

A. EXAMPLES 1–4

Illustrate the Use of Vapor-Phase Surface Modification

Example 1

This example illustrates that effective hydrophobicity in a nanoporous silica film can be obtained by reacting an aged wet film with hexamethyldisilazane vapor in a static chamber.

1. A nanoporous silica precursor was synthesized by adding 208.0 mL of tetraethoxysilane (Pacific Pac, Hollister, Calif. 95023), 61.0 mL of tetraethylene glycol, 33.6 mL of deionized water, 208.0 mL of EtOH, and 0.67 mL of 1N nitric acid together in a round bottom flask. The solution was allowed to mix vigorously then heated to ~80° C. and refluxed for 1.5 hours to form a solution. After the solution was allowed to cool, it was diluted 30% by weight with ethanol to reduce the viscosity and 0.3% by weight with FC-430 surfactant (3M St. Paul Minn. 55144). The diluted precursor was filtered to 0.1 μm using a Teflon filter.
2. Approximately 2.0 ml of the precursor was deposited onto a 4 inch silicon wafer on a spin chuck, and spun at 2500 rpm for 30 seconds.
3. The film was aged for 30.0 min. statically by adding 2 ml of 15M ammonium hydroxide to the bottom of a polypropylene chamber that had a void space of one liter. A stand was placed in the chamber and the film was placed on the stand. The chamber was then covered and water and ammonia from the base are evaporated in the chamber and allowed to diffuse into the film to promote gelation and aging.
4. The film was then placed in another polypropylene chamber in which 10 cc of hexamethyldisilazane (HMDZ) (Pacific Pac, Hollister, Calif. 95023) was added to the bottom of the chamber that had a void space of one liter. A stand was placed in the chamber and the film was placed on the stand. The chamber was then covered and the HMDZ evaporated within the chamber. The film was treated for a sufficient time for the HMDZ vapor to diffuse into the film to render it hydrophobic. In this Example the treatment was continued for 30 minutes.
5. The film was then heated at elevated temperatures. In this Example, the film was heated for 1 min. at 175° C. and for 1 minute at 220° C., in air.
6. The film's thickness and refractive index was measured by ellipsometry. In addition, the hydrophobicity was measured by placing a water drop on the film and observing the water drop's contact angle.
1. The properties of the produced film are shown by Table 5, below.

TABLE 5

| HDMZ Vapor-phase Film | |
| --- | --- |
| Thickness (angstrom) | 10,136 |
| Refractive index ($n_f$) | 1.21 |
| Contact angle | 45° C. |

A portion of the film did crack due to some shrinkage and the large thickness. The portion of the non-cracked film was measured and the water drop had a contact angle of approximately 45°. Also, the drop did not permanently stain the film implying hydrophobicity.

Example 2

This example illustrates that reacting a previously dried nanoporous silica film with hexamethyldisilazane (HMDZ) in the vapor-phase can make it hydrophobic.

1. A nanoporous silica precursor was synthesized by adding 61.0 mL of tetraethoxysilane, 61.0 mL of ethylene glycol, 4.87 mL of deionized water, and 0.2 mL of 1N nitric acid together in a round bottom flask. The solution was allowed to mix vigorously then heated to ~80° C. and refluxed for 1.5 hours to form a solution. After the solution was allowed to cool, the solution was diluted 65% (by vol.) with ethanol to reduce the viscosity and achieve a desirable thickness. The diluted precursor was filtered to 0.1 μm using a Teflon filter.
2. Approximately 2.0 ml of the precursor was deposited onto two 4" inch silicon wafers on a spin chuck, and spun on at 2500 rpm for 30 seconds.
3. The films were aged separately for 30.0 min. statically by adding 2 ml of 15M ammonium hydroxide to the bottom of a polypropylene chamber that had a void space of one liter. A stand was placed in the chamber and the films were placed on the stand. The chamber was then covered and water and ammonia from the base are evaporated in the dish and allowed to diffuse into the films to promote gelation and aging.
4. The film was heated at elevated temperatures for 1 min. each at 175° C. and 300° C. in air.
5. One of the two films was then placed in another polypropylene chamber in which 10 cc of hexamethyldisilazane (HMDZ) was added to the bottom of the chamber that had a void space of one liter. A stand was placed in the chamber and the film was placed on the stand. It was then covered and the HMDZ evaporated in the chamber and diffused in the film to make it hydrophobic. The treatment time took 30 minutes.

6. The film's thickness' and refractive indices were measured by ellipsometry. In addition, the hydrophobicity was measured by placing a water drop on the film and observing the water drop's contact angle. The properties of the produced films are shown in Table 6, below.

TABLE 6

| HMDZ Vapor-phase Film | | |
|---|---|---|
| | HMDZ | no HMDZ |
| Thickness (angstrom) | 3520 | 3600 |
| Refractive index ($n_f$) | 1.11 | 1.14 |
| Contact angle | >90° | <10° |

Both films were low in refractive indices and had similar thickness'. The contact angle of the films were substantially different. The HMDZ treated film had a contact angle greater than 90° implying a hydrophobic film, while the non-HMDZ treated film completely wet the film and left a permanent mark.

Example 3

This example demonstrates that treatment of a wet nanoporous silica film with HMDZ flowing vapor can render the nanoporous film hydrophobic.

1. A nanoporous silica precursor was synthesized by adding 94.0 mL of tetraethoxysilane, 61.0 mL of triethylene glycol monomethyl ether, 7.28 mL of deionized water, and 0.31 mL of 1N nitric acid together in a round bottom flask. The solution was allowed to mix vigorously then heated to ~80° C. and refluxed for 1.5 hours to form a stock solution. After the solution was allowed to cool, it was diluted 50% by weight with ethanol to reduce the viscosity. The diluted precursor was filtered to 0.1 μm using a Teflon filter.
2. Approximately 2.0 ml of the precursor was deposited separately onto two 4" inch silicon wafers on a spin chuck, and spun at 2500 rpm for 30 seconds.
3. The films were aged by placing them into an aging chamber through which compressed air was flowed through a water bubbler and into the chamber at a rate of 2 l/min. for 2 minutes which produced a relative humidity of 75% within the chamber. After this the chamber was evacuated to 195 mbar. Immediately following the evacuation, ammonia gas was dosed in to a pressure of 808 mbar. After dosing, each film was aged at this pressure for 2 minutes. After aging, the chamber was once again evacuated, this time to ~5 mbar, and then backfilled with air to ambient pressure.
4. One of the films then underwent a hydrophobic step in which nitrogen flowing at 5 liters/minute was bubbled through hexamethyldisilazane liquid. As noted above, FIG. 1 is a diagram of the apparatus used to do the treatment. The nitrogen/HMDZ vapor flowed into a chamber in which the aged film sat for 15 minutes.
5. A control was conducted using a proven method of producing hydrophobic nanoporous silica films. This was done by depositing 20–30 mL of a 50/50 (by vol.) mixture of acetone, and hexamethyldisilazane. This was done while the film at was spinning 250 rpm's for 20 seconds without allowing the film to dry. The films were then spun dry at 1000 rpm for 5 seconds
6. The films were heated at elevated temperatures for 1 min. each at 175° C. and 320° C. in air.

7. The films were characterized for hydrophobicity by placing a water drop on the film and observing the water drop's contact angle. In addition the refractive indices and thickness' were also measured. The properties of the produced films are shown by Table 7, below.

TABLE 7

| Results of treatment of wet nanoporous silica film with Acetone/HMDZ solvent | | |
|---|---|---|
| | HMDZ Vapor-phased film | Acetone/HMDZ solvent exchanged film |
| Thickness (angstroms) | 6300 | 7500 |
| Refractive index | 1.125 | 1.112 |
| Contact angle | >45° but <90° (beads slightly but does not stain film) | >90° (beads and does not stain film |

Results

The results provided by Table 7, above, show that the films shrank slightly. Shrinkage means that there is a loss in film thickness between the pre-silylation thickness and the thickness of the final dried film. In a hydrophilic film (i.e. no surface modification) a water drop will completely wet the film and leave a permanent stain on the film. This is due to water adsorbing in the pores. In a situation, as for this Example, when the HMDZ vapor-phase treated film has a the contact angle that is not as high as that of the control, but nevertheless the water drop does not wet or stain the film, this is considered to be a confirmation that the film is somewhat hydrophobic.

Example 4

This example demonstrates that heating liquid hexamethyldisilazane (HMDZ) and flowing nitrogen through it, can make a previously-dried nanoporous silica film hydrophobic.

1. A nanoporous silica precursor was synthesized by adding 94.0 mL of tetraethoxysilane, 61.0 mL of triethylene glycol monomethyl ether, 7.28 mL of deionized water, and 0.31 mL of 1N nitric acid together in a round bottom flask. The solution was allowed to mix vigorously then heated to ~80° C. and refluxed for 1.5 hours to form a stock solution. After the solution was allowed to cool, it was diluted 50% by weight with ethanol to reduce the viscosity. The diluted precursor was filtered to 0.1 μm using a Teflon filter.
2. Approximately 2.0 ml of the precursor was deposited separately onto two 4" inch silicon wafers on a spin chuck, and spun at 2500 rpm for 30 seconds.
3. The films were aged by placing them into an aging chamber through which compressed air was flowed through a water bubbler and into the chamber at a rate of 2 l/min. for 2 minutes which produced a relative humidity of 75% within the chamber. After this the chamber was evacuated to 195 mbar. Immediately following the evacuation, ammonia gas was dosed in to a pressure of 808 mbar. After dosing, each film was aged at this pressure for 2 minutes. After aging, the chamber was once again evacuated, this time to ~5 mbar, and then backfilled with air to ambient pressure.
4. One of the films then underwent a hydrophobic step in which nitrogen flowing at 5 liters/minute was bubbled through slightly heated (30° C.) hexamethyldisilazane liquid. FIG. 1 is a diagram of the apparatus that was used to do the treatment. The nitroge/HMDZ vapor flowed into the chamber in which the aged film sat for 15 minutes.

5. A control was processed with a proven method of producing hydrophobic nanoporous silica films. This was done by depositing 20–30 mL of a 50/50 (by vol.) mixture of acetone, and hexamethyldisilazane at a temperature of about 30° C. This was done while the film was spinning at 250 rpm's for 20 seconds, without allowing the film to dry. The films were then spun dry at 1000 rpm for 5 seconds 6. The films were heated at elevated temperatures for 1 min. each at 175° C. and 320° C. in air.

7. The films were characterized for hydrophobicity by placing a water drop on the film and observing the water drop's contact angle. In addition the refractive indices and thickness' were also measured for comparison purposes. The properties of the produced films are shown below by Table 8.

TABLE 8

Properties of films formed by heating liquid hexamethyldisilazane (HMDZ) and flowing nitrogen through it

|  | HMDZ Vapor-phased film | Acetone/HMDZ solvent exchanged film |
|---|---|---|
| Thickness (angstroms) | 6900 | 7500 |
| Refractive Index | 1.12 | 1.112 |
| Contact angle | >45° but <90° (beads slight but does not stain film) | >90° (beads and does not stain film) |

1. The results show that the films shrank slightly. In addition, the contact angles of the HMDZ vapor-phased film was not as high as the control, although it did not wet the film implying it was hydrophobic. Table 8's values are essentially the same as those of Table 7, supra, although the instant data resulted from HMDZ being heated to 30° C., whereas the data presented by Table 7 resulted from the HMDZ reaction being conducted at ambient temperature.

B. EXAMPLES 5–10

Illustrate the Advantages of a Ketone Co-Solvent

Example 5

This example illustrates that mixtures of alcohols and hexamethyldisilazane (HMDZ) for use as a surface modification agent for a tetraethylene glycol (TEG) derived film, yield poor film qualities.

1. A nanoporous silica precursor was synthesized by adding 61.0 mL of tetraethoxysilane, 61.0 mL of tetraethylene glycol, 4.87 mL of deionized water, and 0.2 mL of 1N nitric acid together in a round bottom flask. The solution was allowed to mix vigorously then heated to ~80° C. and refluxed for 1.5 hours to form a solution. After the solution was allowed to cool, it was diluted 50% by weight with ethanol to reduce the viscosity and 0.3% by weight with FC-430 surfactant (3M St. Paul Minn. 55144). The diluted precursor was filtered to 0.1 µm using a Teflon filter.

2. Approximately 2.0 ml of the precursor was deposited onto two different 4" inch silicon wafers on a spin chuck, and spun at 2500 rpm for 30 seconds each.

3. The films were gelled and aged in a vacuum chamber using the following conditions: 1) The chamber was evacuated to 127 torr. 2) Next, 15M ammonium hydroxide was heated and equilibrated at 45° C. and dosed into the chamber to increase the pressure to 533 torr for 2–3 minutes. 3) Finally, the chamber was evacuated to 127 torr and backfilled with nitrogen.

4. The films were then solvent exchanged by which 20–30 mL of a 50/50 (by vol.) mixture of either ethanol (EtOH) or isopropanol (IPA) and hexamethyldisilazane were spun on the film at 250 rpm's for 20 seconds without allowing the film to dry. The films were then spun dry at 1000 rpm for 5 seconds 5. The films were heated at elevated temperatures for 1 min. each at 175° C. and 320° C. in air.

6. The films were then characterized by ellipsometry to determine the refractive indices and thickness;. In addition, the hydrophobicity was tested by placing a water drop onto the film to determine the contact angle. Table 9 shows the properties of the produced films.

TABLE 9

Properties of Films Produced with Alcohol/HMDZ Mixtures

|  | EtOH/HMDZ | IPA/HMDZ |
|---|---|---|
| Thickness (Angstroms) | 6500 | 6000 |
| Refractive index | 1.155 | 1.156 |
| Hydrophobicity (contact angle) | <20° | <20° |

The films shrank and substantially and partially densified. In addition, the contact angle of the water drop on the films were quite low and spread and wet the films indicating that they were hydrophilic.

Example 6

This example illustrates that mixtures of inert solvents in and hexamethyldisilazane (HMDZ) for use as a surface modification agent for tetraethylene glycol (TEG) derived films, yield poor film qualities when characterized.

1. A nanoporous silica precursor was synthesized by adding 61.0 mL of tetraethoxysilane, 61.0 mL of tetraethylene glycol, 4.87 mL of deionized water, and 0.2 mL of 1N nitric acid together in a round bottom flask. The solution was allowed to mix vigorously then heated to ~80° C. and refluxed for 1.5 hours to form a solution. After the solution was allowed to cool, it was diluted 50% by weight with ethanol to reduce the viscosity and 0.3% by weight with FC-430 surfactant (3M St. Paul Minn. 55144). The diluted precursor was filtered to 0.1 µm using a Teflon filter.

2. Approximately 2.0 ml of the precursor was deposited onto two different 4" inch silicon wafers on a spin chuck, and spun at 2500 rpm for 30 seconds.

3. The films were gelled and aged in a vacuum chamber using the following conditions: 1) The chamber was evacuated to 533 torr. 2) Next, 15M ammonium hydroxide was heated and equilibrated at 45° C. and dosed into the chamber to increase the pressure to 127 torr for 2–3 minutes. 3) Finally, the chamber was evacuated to 533 torr and backfilled with nitrogen.

4. The films were then solvent exchanged by which 20–30 mL of a 50/50 (by vol.) mixture of either 1,4 dioxane or butyl ether and hexamethyldisilazane were spun on the film at 250 rpm's for 20 seconds without allowing the film to dry. The films were then spun dry at 1000 rpm for 5 seconds.

5. The films were heated at elevated temperatures for 1 min. each at 175° C. and 320° C. in air.
6. The films were then characterized by ellipsometry to determine the refractive indices and thickness'. In addition, the hydrophobicity was tested by placing a water drop onto the film to determine the contact angle. Table 10 shows the properties of the produced films.

TABLE 10

Properties of Films Produced with Inert Solvent/HMDZ Mixtures

|  | 1,4 Dioxane/HMDZ | Butyl Ether/HMDZ |
| --- | --- | --- |
| Thickness (Angstroms) | 4700 | 3970 |
| Refractive index | 1.187 | 1.21 |
| Hydrophobicity (contact angle) | <20° | <20° |

The films shrank and densified substantially. In addition, the films also wetted when a drop of water was placed on the film indicating they were quite hydrophilic.

Example 7

This example illustrates that the mixtures of ketones and hexamethyldisilazane (HMDZ) for use as a surface modification agent for triethylene glycol monomethyl ether (TriEGMME) derived films, yield excellent film qualities when fully characterized.

1. A nanoporous silica precursor was synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution was allowed to mix vigorously then heated to ~80° C. and refluxed for 1.5 hours to form a solution. After the solution was allowed to cool, it was diluted 25% by weight with ethanol to reduce the viscosity. The diluted precursor was filtered to 0.1 μm using a Teflon filter.
2. Approximately 8.0–10.0 ml of the precursor was deposited onto 8" inch silicon wafers on a spin chuck, and spun at 2500 rpm for 30 seconds.
3. The films were gelled and aged in a vacuum chamber using the following conditions: 1) The chamber was evacuated to 250 torr. 2) Next, 15M ammonium hydroxide was heated and equilibrated at 45° C. and dosed into the chamber to increase the pressure to 660 torr for 2–3 minutes. 3) Finally, the chamber was evacuated to 250 torr and backfilled with nitrogen.
4. The films were then solvent exchanged by which 20–30 mL of a 50/50 (by vol.) mixture of either acetone, 2-pentanone, 3-pentanone, 2,4-pentanedione, and hexamethyldisilazane were spun on the film at 250 rpm's for 20 seconds without allowing the film to dry. The films were then spun dry at 1000 rpm for 5 seconds
5. The films were heated at elevated temperatures for 1 min. each at 175° C. and 320° C. in air.
6. The films were characterized by ellipsometry to determine the refractive indices and thickness'. In addition, the infrared spectra (IR) of the films were compared, in FIG. 2, to determine the relationship between the chemical compositions of the respective films. The hydrophobicity of the films were measured by placing a water drop onto each film to determine the contact angle. Table 11 below shows the properties of the produced films.

TABLE 11

Properties of Films Produced with Ketone/HMDZ Mixtures

|  | Acetone | 2-Pentanone | 3-Pentanone | 2,4 Pentanedione |
| --- | --- | --- | --- | --- |
| Thickness (Angstroms) | 9783 | 9071 | 9586 | 9620 |
| Refractive Index | 1.14 | 1.14 | 1.139 | 1.137 |
| Hydrophobicity (contact angle) | >80° | >80° | >80° | >80° |

Thus, the produced films had low refractive indices and uniform thickness'. The contact angle was uniformly greater than 80° C. across the wafer, indicating excellent hydrophobicity. The chemical composition of the nanoporous films prepared using HMDZ mixed with one of 2,4-dimethyl-3-pentanone, acetone, 3-pentanone and 2-pentanone, respectively, was the same, as confirmed by the overlap of the respective absorbance peaks at, e.g., 1000–1200 cm$^{-1}$ for all produced films, as illustrated by FIG. 2.

Example 8

This example illustrates that mixtures of acetone and hexamethyldisilazane (HMDZ) for use as a surface modification agent for triethylene glycol monomethyl ether (TriEGMME) derived films, yield excellent film qualities, however the stability of the solution is limited to less than 24 hours.

1. A nanoporous silica precursor was synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution was allowed to mix vigorously then heated to ~80° C. and refluxed for 1.5 hours to form a solution. After the solution was allowed to cool, it was diluted 25% by weight with ethanol to reduce the viscosity. The diluted precursor was filtered to 0.1 μm using a Teflon filter.
2. Approximately 8.0–10.0 ml of the precursor was deposited onto 8" inch silicon wafers on a spin chuck, and spun at 2500 rpm for 30 seconds.
3. The films were gelled and aged in a vacuum chamber using the following conditions: 1) The chamber was evacuated to 250 torr. 2) Next, 15M ammonium hydroxide was heated and equilibrated at 45° C. and dosed into the chamber to increase the pressure to 660 torr for 2–3 minutes. 3) Finally, the chamber was evacuated to 250 torr and backfilled with nitrogen.
4. The films were then solvent exchanged by depositing 20–30 mL of an aged (36hrs) 50/50 (by vol.) mixture of acetone, and hexamethyldisilazane (HMDZ). A freshly diluted (<2 hrs) mixture of acetone/HMDZ was also deposited for comparative purposes. The solutions were spun on the films at 250 rpm's for 20 seconds without allowing the film to dry. The films were then spun dry at 1000 rpm for 5 seconds
5. The films were heated at elevated temperatures for 1 min. each at 175° C. and 320° C. in air.
6. The films were characterized by ellipsometry to determine the refractive indices and thickness'. In addition, the hydrophobicity was tested by placing a water drop onto the film to determine the contact angle. Table 12, below, illustrates the results of the experiment.

TABLE 12

Properties of films formed with Acetone/HMDZ mixtures

|  | Acetone/HMDZ (freshly diluted) | Acetone/HMDZ (38 hr diluted) |
|---|---|---|
| Thickness (Angstroms) | 9071 | 7950 |
| Refractive index | 1.14 | 1.157 |
| Hydrophobicity (contact angle) | >80° | <20° |

As can be seen in Table 12, above, the 38 hr. mixture no longer yields the same acceptable film properties as the freshly diluted mixture.

Example 9

This example illustrates that mixtures of higher boiling point ketones and hexamethyldisilazane (HMDZ) for use as a surface modification agent for triethylene glycol monomethyl ether (TriEGMME) derived films, yield excellent film qualities when fully characterized. In addition, the mixture is quite stable as opposed to acetone.

1. A nanoporous silica precursor was synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution was allowed to mix vigorously then heated to ~80° C. and refluxed for 1.5 hours to form a solution. After the solution was allowed to cool, it was diluted 25% by weight with ethanol to reduce the viscosity. The diluted precursor was filtered to 0.1 μm using a Teflon filter.
2. Approximately 8.0–10.0 ml of the precursor was deposited onto 8 inch silicon wafers on a spin chuck, and spun at 2500 rpm for 30 seconds.
3. The films were gelled and aged in a vacuum chamber using the following conditions: 1) The chamber was evacuated to 250 torr. 2) Next, 15M ammonium hydroxide was heated and equilibrated at 45° C. and dosed into the chamber to increase the pressure to 660 torr for 2–3 minutes. 3) Finally, the chamber was evacuated to 250 torr and backfilled with nitrogen.
4. The films were then solvent exchanged by which a 50/50 (by vol.) mixture of either 3-pentanone, or 2,4-pentanedione, and hexamethyldisilazane were mixed together. The stability of the solution was monitored over a 3 month period by gas chromatography mass spectrometry (GC/MS). The results of the stability study are shown in Table 13, below.

TABLE 13

GC/MS Stability Resulting from Higher Boiling Point Ketone/HMDZ Mixtures (values are % of total)

| Compound | 3-Pentanone (Time 0 days) | 3-Pentanone (Time 30 days) | 2,4 Pentanedione (Time 0 days) | 2,4 Pentanedione (Time 30 days) |
|---|---|---|---|---|
| HMDS | 2.42% | 7.36% | 4.2% | 4.9% |
| HMDZ | 65.9% | 57.8% | 65.2 | 57.19% |
| Ketone | 31.67% | 34.5% | 30.62% | 37.2% |

The results confirm that there was very little percent change of compounds in the mixtures when compared from 0 to 30 days.

5. Approximately 20–30 mls of the mixtures were spun on the film at 250 rpm's for seconds without allowing the film to dry. The films were then spun dry at 1000 rpm for 5 seconds.
6. The films were heated at elevated temperatures for 1 min. each at 175° C. and 320° C. in air.
7. The films were characterized by ellipsometry to determine the refractive indices and thickness'. In addition, the hydrophobicity was measured by placing a water drop onto the top of the film to determine the contact angle of the drop. Table 14 lists the results of the testing of the films produced for the stability study.

TABLE 14

Characterization Results of Ketone/HMDZ Films at 0 and 30 days

|  | 3-Pentanone (0 days) | 3-Pentanone (30 days) | 2,4 Pentanedione (0 days) | 2,4 Pentanedione (30 days) |
|---|---|---|---|---|
| Thickness (Angstroms) | 9586 | 9432 | 9620 | 9565 |
| Refractive Index | 1.139 | 1.135 | 1.137 | 1.135 |
| Hydrophobicity (contact angle) | >80° | >80° | >80° | >80° |

The thickness and refractive indices are virtually the same from day 0 to day 30. In all cases the contact angle of the water drop was greater than 80 degrees, implying that the film is strongly hydrophobic.

Example 10

This example illustrates that a mixture of 3-pentanone and methyltriacetoxysilane (MTAS) for use as a solvent exchange fluid for triethylene glycol monomethyl ether (TriEGMME) derived films, yields excellent film qualities when fully characterized.

1. The precursor was synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution was allowed to mix vigorously then heated to ~80° C. and refluxed for 1.5 hours to form a solution. Afer the solution was allowed to cool, it was diluted 25% by weight with ethanol to reduce the viscosity. The diluted precursor was filtered to 0.1 μm using a Teflon filter.
2. Approximately 2–3 ml of the precursor was deposited onto 4 inch silicon wafers on a spin chuck, and spun at 2500 rpm for 30 seconds.
3. The films were aged for 10.0 min. statically by adding 1 ml of 15M ammonium hydroxide to the bottom of a petri-dish. A film is placed on a stand in the petri-dish and the dish is covered. Water and ammonia from the base are evaporated in the dish and allowed to diffuse into the film to promote gelation.
4. The films were then solvent exchanged by which a 5/95% (by wt.) mixture of methyltriacetoxysilane (Gelest, Tullytown, Pa., 19007) and 3-pentanone were mixed together. A control was also processed in which a 50/50 (by vol.) mixture of acetone and hexamethyldililazane (HMDZ) was used as the surface modification agent. Approximately 20–30 mls of the mixtures were spun on the film at 250 rpm's for 20 seconds without allowing the film to dry. The films were then spun dry at 2500 rpm for 10 seconds.

5. The films were heated at elevated temperatures for 1 min. each at 175° C. and 320° C. in air. The films were then cured for approximately 30 minutes at 400° C. in nitrogen in a horizontal tube furnace with less than 100 ppm of oxygen present.

6. The films were characterized by ellipsometry to determine the refractive indices and thickness'. In addition, the hydrophobicity was measured by placing a water drop onto the top of the film to determine the contact angle of the drop. The dielectric constant was also measured at 1 MHz to ensure that the films were indeed hydrophobic and low in capacitance. Table 15 below, lists the properties of the produced nanoporous silica films.

TABLE 15

Characterization Results of Surface Modified Films

|  | 50/50 HMDZ/3-pentanone | 5% MTAS/95% 3-pentanone |
| --- | --- | --- |
| Thickness (Å) | 8570 | 7661 |
| Refractive Index | 1.135 | 1.148 |
| Dielectric Constant | 2.0 | 2.02 |
| Contact angle | >80° | <45° |

The thickness' and refractive indices were uniform across the wafer. The contact angle of the water drops for the two films differed greatly. In the case of the HMDZ treated film, the contact angle was greater then 80 degrees while the MTAS surface modified film had a much lower contact angle (<45°), however the dielectric constant, which is the important measurement, did not differ.

What is claimed is:

1. A process for treating a nanoporous silica dielectric film on a substrate, which comprises reacting a suitable hydrophilic nanoporous silica film with a vapor phase material, said vapor phase material comprising an effective amount of a surface modification agent, wherein said nanoporous silica film is present on a substrate and has a pore structure with hydrophilic pore surfaces, and wherein said reaction is conducted for a period of time sufficient for said surface modification agent to penetrate said pore structure and produce a treated nanoporous silica film having a dielectric constant of about 3 or less, wherein said surface modification agent is hydrophobic and suitable for silylating silanol moieties on said hydrophilic pore surfaces.

2. The process of claim 1 wherein said surface modification agent is a compound having a formula selected from the group consisting of: $R_3SiNHSiR_3$, $R_xSiCl_y$, $R_xSi(OH)_y$, $R_3SiOSiR_3$, $R_xSi(OR)_y$, $M_pSi(OH)_{[4-p]}$, $R_xSi(OCOCH_3)_y$ and combinations thereof, wherein x is an integer ranging from 1 to 3, y is an integer ranging from 1 to 3, p is an integer ranging from 2 to 3, each R is an independently selected hydrophobic organic moiety, each M is an independently selected hydrophobic organic moiety; and R and M can be the same or different.

3. The process of claim 2 wherein R and M are the same or different and are independently selected from the group of organic moieties consisting of alkyl, aryl and combinations thereof.

4. The process of claim 3 wherein said alkyl moiety is substituted or unsubstituted and is selected from the group consisting of straight alkyl, branched alkyl, cyclic alkyl and combinations thereof, and wherein said alkyl moiety ranges in size from $C_1$ to about $C_{18}$.

5. The process of claim 3 wherein said aryl moiety is substituted or unsubstituted and ranges in size from $C_5$ to about $C_{18}$.

6. The process of claim 1 wherein said surface modification agent is selected from the group consisting of acetoxytrimethylsilane, acetoxysilane, diacetoxydimethylsilane, methyltriacetoxysilane, phenyltriacetoxysilane, diphenyldiacetoxysilane, trimethylethoxysilane, trimethylmethoxysilane, 2-trimethylsiloxypent-2-ene-4-one, n-(trimethylsilyl) acetamide, 2-(trimethylsilyl)acetic acid, n-(trimethylsilyl) imidazole, trimethylsilylpropiolate, trimethylsilyl (trimethylsiloxy)-acetate, nonamethyltrisilazane, hexamethyldisilazane, hexamethyldisiloxane, trimethylsilanol, triethylsilanol, triphenylsilanol, t-butyldimethylsilanol, diphenylsilanediol and combinations thereof.

7. The process of claim 6 wherein said surface modification agent is hexamethyldisilazane.

8. The process of claim 1 wherein said hydrophilic nanoporous silica film has been aged prior to conducting said reaction.

9. The process of claim 1 wherein said vapor phase material further comprises a carrier gas.

10. The process of claim 9 wherein said vapor phase material comprises a surface modification agent in an amount ranging from about 0.1 to about 50 mole percent relative to said carrier gas.

11. The process of claim 1 wherein said reaction is conducted at a temperature ranging from about 20° C. to about 30° C.

12. The process of claim 1 wherein said reaction is conducted for a time period ranging from about 5 minutes to about 6 hours.

13. The process of claim 1 wherein said surface modification reagent is vaporized by a method selected from the group consisting of evaporation, heating, atomization and combinations thereof.

14. The process of claim 1 further comprising the step of heating the treated nanoporous film at a temperature effective to remove any significant amounts of vapor phase material, without causing significant thermal damage to the reacted nanoporous film.

15. The process of claim 14 wherein said heating step is conducted in two parts, with a first heating step conducted for a duration of about 1 minute at a temperature ranging from about 150 to about 200° C., followed by a second heating step for a duration of about 1 minute at a temperature ranging from about 250 to about 350° C.

16. The process of claim 1 wherein said vapor phase material further comprises a co-reactant or co-solvent.

17. The process of claim 16 wherein said co-reactant or co-solvent is a ketone.

18. The process of claim 16 wherein said co-reactant or co-solvent is selected from the group consisting of cyclopentanone, diisopropylketone, 2,4-Pentanedione, dioxane, n-butanol, 2-pentanol, 1,2-diaminopropane, 1-dimethylamino-2 propanone, water and combinations thereof.

19. The process of claim 1 wherein said substrate is a silicon wafer suitable for production of an integrated circuit.

20. The process of claim 1 wherein said nanoporous silica film is in a wet condition at the start of the reaction.

21. A process for treating a nanoporous silica dielectric film on a substrate, which comprises reacting a suitable nanoporous silica film with an effective amount of a reaction solution, said reaction solution comprising a mixture of an effective amount of a surface modification agent, together with an effective amount of a ketone co-solvent, wherein said nanoporous silica film is present on a substrate and has a pore structure with hydrophilic pore surfaces, and wherein said reaction is conducted for a period of time sufficient for reaction solution to penetrate said pore structure and produce a nanoporous silica film having a dielectric constant of about 3 or less, wherein said surface modification agent is hydrophobic and suitable for silylating silanol moieties on said hydrophilic pore surfaces.

22. The process of claim 21 wherein said surface modification agent has a formula selected from the group consisting of: $R_3SiNHSiR_3$, $R_xSiCl_y$, $R_xSi(OH)_y$, $R_3SiOSiR_3$, $R_xSi(OR)_y$, $M_pSi(OH)_{[4-p]}$, $R_xSi(OCOCH_3)_y$ and combinations thereof, wherein x is an integer ranging from 1 to 3, y is an integer ranging from 1 to 3, p is an integer ranging from 2 to 3, each R is an independently selected hydrophobic organic moiety, each M is an independently selected hydrophobic organic moiety; and R and M can be the same or different.

23. The process of claim 22 wherein R and M are the same or different and are independently selected from the group consisting of alkyl, aryl and combinations thereof.

24. The process of claim 23 wherein said alkyl moiety is substituted or unsubstituted and is selected from the group consisting of straight alkyl, branched alkyl, cyclic alkyl and combinations thereof, and wherein said alkyl moiety ranges in size from $C_1$ to about $C_{18}$.

25. The process of claim 23 wherein said aryl moiety is substituted or unsubstituted and ranges in size from $C_5$ to about $C_8$.

26. The process of claim 21 wherein said surface modification agent is selected from the group consisting of acetoxytrimethylsilane, acetoxysilane, diacetoxydimethylsilane, methyltriacetoxysilane, phenyltriacetoxysilane, diphenyldiacetoxysilane, trimethylethoxysilane, trimethylmethoxysilane, 2-trimethylsiloxypent-2-ene-4-one, n-(trimethylsilyl) acetamide, 2-(trimethylsilyl)acetic acid, n-(trimethylsilyl) imidazole, trimethylsilylpropiolate, trimethylsilyl (trimethylsiloxy)-acetate, nonamethyltrisilazane, hexamethyldisilazane, hexamethyldisiloxane, trimethylsilanol, triethylsilanol, triphenylsilanol, t-butyldimethylsilanol, diphenylsilanediol, and combinations thereof.

27. The process of claim 26 wherein said surface modification agent is hexamethyldisilazane.

28. The process of claim 21 wherein said hydrophilic film has been aged prior to conducting said reaction.

29. The process of claim 21 wherein said reaction solution comprises a surface modification agent and a ketone cosolvent in a ratio that ranges from about 10:90 to about 90:10 parts of surface modification agent to ketone cosolvent, by volume.

30. The process of claim 29 wherein the ratio of surface modification agent to ketone in said reaction solution is about 50:50, by volume.

31. The process of claim 21 wherein said ketone is selected from the group consisting of acetone, 2-butanone, 2-pentanone, 3-pentanone, 2,4-dimethyl-3-pentanone, cyclopentanone, cyclohexanone and combinations thereof.

32. The process of claim 21 wherein said ketone is ultrapurified to contain less than 0.1 parts per billion of heavy metal impurities.

33. The process of claim 21 further comprising the step of heating the treated nanoporous film at a temperature effective to remove any significant amounts of remaining reaction solution, without causing any significant thermal damage to the reacted nanoporous film.

34. The process of claim 33 wherein said heating step is conducted in two parts, with a first heating step conducted for a duration of about 1 minute at a temperature ranging from about 150 to about 200° C., followed by a second heating step for a duration of about 1 minute at a temperature ranging from about 250 to about 350° C.

35. The process of claim 21 wherein said substrate is a silicon wafer suitable for production of an integrated circuit.

* * * * *